United States Patent [19]

Schultz

[11] 4,137,492

[45] Jan. 30, 1979

[54] STORED ENERGY MODULE

[75] Inventor: Forrest O. E. Schultz, Owosso, Mich.

[73] Assignee: Midland-Ross Corporation, Cleveland, Ohio

[21] Appl. No.: 747,245

[22] Filed: Dec. 3, 1976

[51] Int. Cl.² .................. G05F 1/46; H02M 3/155
[52] U.S. Cl. .................................. 320/1; 323/93; 361/194; 280/6 R
[58] Field of Search ............... 320/1; 307/109; 361/194; 323/93

[56] References Cited

U.S. PATENT DOCUMENTS

| 3,271,630 | 9/1966 | Miyazawa | 361/194 |
| 3,427,522 | 2/1969 | Redmond | 320/1 X |
| 3,470,446 | 9/1969 | Berry et al. | 323/93 X |
| 3,652,914 | 3/1972 | Krausser | 320/1 |

Primary Examiner—Stuart N. Hecker
Attorney, Agent, or Firm—H. Duane Switzer

[57] ABSTRACT

A battery is connectable through a mechanical switch to bias a solid state switch and to charge a capacitor. When the mechanical switch is open, the capacitor supplies current to bias the solid state switch. The battery is connected for supplying a trickle electrical current to the capacitor when the mechanical switch is open for maintaining a charge on the capacitor for a substantial period of time without materially discharging the battery.

1 Claim, 2 Drawing Figures

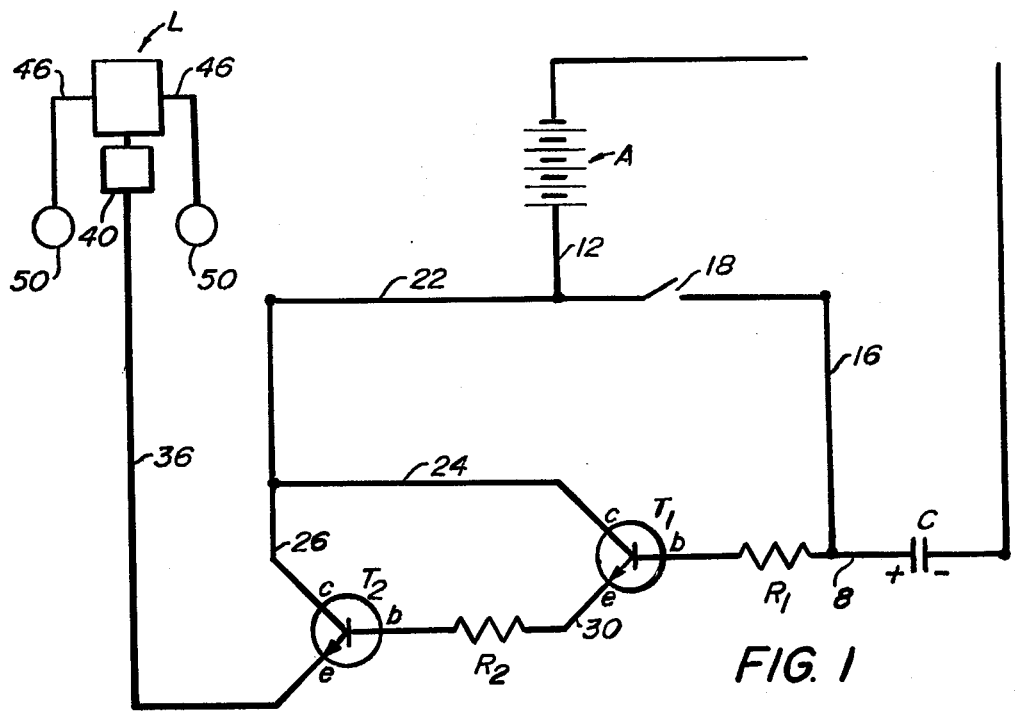
FIG. 1
FIG. 2
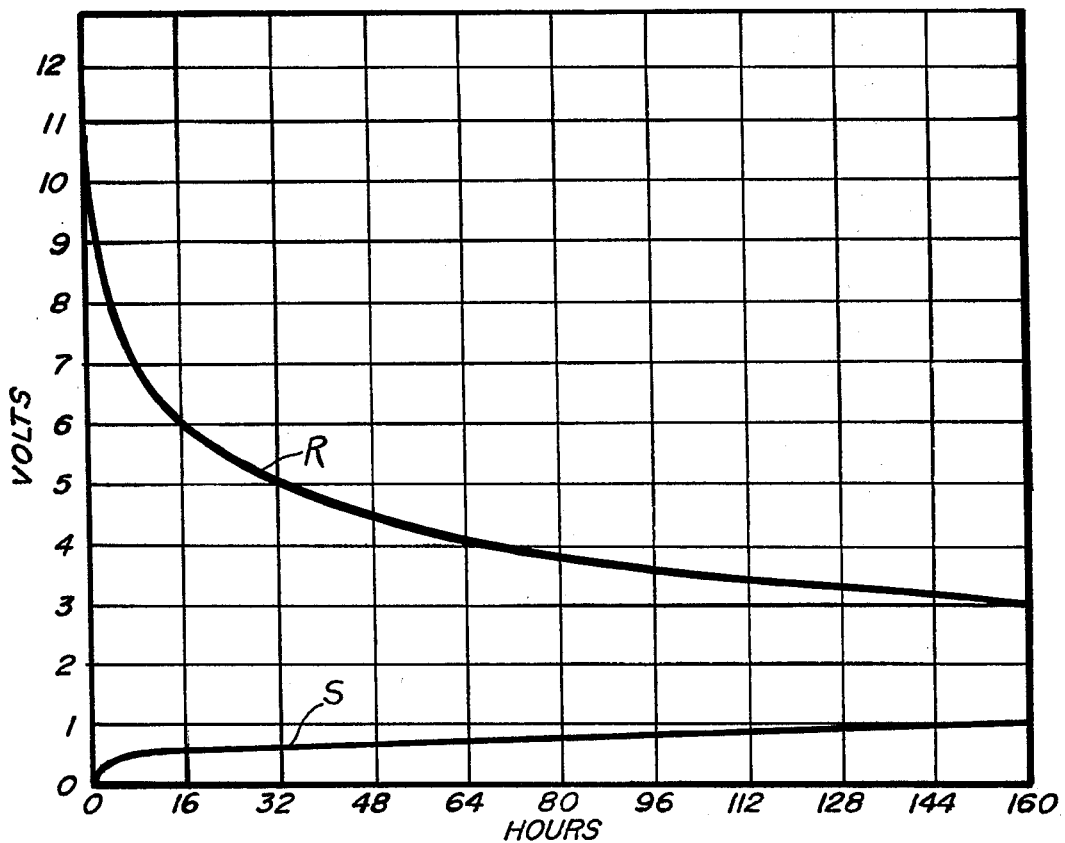

STORED ENERGY MODULE

BACKGROUND OF THE INVENTION

This application relates to the art of storing electrical energy and, more particularly, to storage of electrical energy for an extended period of time on a capacitor. The invention is particularly applicable for use in an automatic automobile leveling system and will be described with reference thereto. However, it will be appreciated that the invention has broader aspects and may be used in other environments where it is desired to store a useful charge on a capacitor for an extended period of time.

Automatic leveling systems for automobiles operate off the automobile electrical system when the ignition is turned on. When the weight of a large number of passengers and luggage is removed from an automobile after the ignition is turned off, the automatic leveling system is not operative and the automobile will assume an extreme out-of-level condition. This is frequently undesirable for aesthetic and other reasons. Therefore, it would be desirable to have the automatic leveling system operative after the ignition is turned off. However, bypassing the ignition switch and connecting the battery directly to the leveling system could discharge the battery to a point where it was no longer capable of starting the engine. For example, vandals or a high wind could cause nearly constant operation of the leveling system until the battery was seriously discharged. In addition, the vehicle could be parked with its bumper above or below an obstruction which would prevent movement of the vehicle to a balanced condition and the constant operation of the leveling system in attempting to balance the vehicle would soon discharge the battery. It would be desirable to have an arrangement whereby the automatic leveling system would be operative for a limited time after the ignition is turned off and to utilize this time at one or more random intervals over an extended storage period. This would protect the battery against severe discharge and provide for normal leveling of the unattended vehicle.

SUMMARY OF THE INVENTION

A useful charge is maintained on a capacitor by supplying a trickle electrical current to the capacitor from a battery.

In one arrangement, a capacitor is series connected to a transistor for applying a forward bias to its base. A battery is connected for applying a reverse bias through the transistor collector to the transistor base. The battery is connected through a mechanical switch between the capacitor and transistor for charging the capacitor and applying a forward bias to the transistor base when the mechanical switch is closed. When the mechanical switch is open, the capacitor is capable of supplying the forward bias to the transistor. The trickle electrical current supplied to the capacitor is due to leakage through the transistor and this prevents the normal decay of the charge on the capacitor for a relatively long period of time.

It is a principal object of the present invention to provide an improved arrangement for maintaining a useful charge on a capacitor for an extended period of time.

It is also an object of the invention to maintain a useful charge on a capacitor for an extended period of time without seriously discharging a battery used for maintaining the capacitor charge.

It is an additional object of the invention to provide an arrangement for maintaining a useful charge on a capacitor until the charge is used and to protect a battery against discharge by connecting the battery to the capacitor in such a manner that the capacitor will not be recharged until the battery recharging system is put into operation.

It is a further object of the invention to provide an improved automatic leveling system for automobiles wherein the automobile will be leveled at least one time after the ignition is turned off.

BRIEF DESCRIPTION OF THE DRAWING

FIG. 1 is a diagrammatic illustration of a circuit having the improvements of the present invention incorporated therein; and FIG. 2 is a graph illustrating how a charge is maintained on a capacitor and how a discharged capacitor is recharged.

DESCRIPTION OF A PREFERRED EMBODIMENT

With reference to the drawing, FIG. 1 shows a circuit representative of the stored energy module of the present invention. A voltage source represented by a conventional 12 volt automobile battery A is connected to line 8 between capacitor C and resistor $R_1$ by lines 12 and 16 having a normally open accessory switch 18 therein and which is closed when the automobile ignition switch is turned on. Transistors $T_1$ and $T_2$ each have a base, collector and emitter represented in the drawing by letters b, c and e. In the arrangement shown, transistors $T_1$ and $T_2$ define a solid state switch.

Line 8 is connected with the base of transistor $T_1$ which in turn has its emitter connected by line 30 through resistor $R_2$ with the base of transistor $T_2$. Battery A is connected by lines 12, 22, 24 and 26 with the collectors of transistors $T_1$ and $T_2$. The emitter of transistor $T_2$ is connected by line 36 with a level sensing means 40 normally installed on an automobile and connected with a leveling means L which is operative through conduits 46 for supplying or bleeding air from air adjustable shock absorbers 50 on the rear of an automobile. The leveling system itself may take many forms including the type disclosed in U.S. Pat. Nos. 3,122,379 issued Feb. 25, 1964 to Allinquant; and Boone 3,233,909 issued Feb. 8, 1966.

When mechanical switch 18 is closed, battery A supplies current through the solid state switch to the load defined by leveling device L and also charges capacitor C. When mechanical switch 18 is open, capacitor C is connected for supplying the bias to transistor $T_1$ of the solid state switch. This forward bias to the transistor switch provided by the capacitor allows current to flow through the transistor switch from the battery as demanded by the load. A small current also flows from the capacitor when the load demands current so that the charge on the capacitor is reduced to a level insufficient to provide the necessary forward bias to the transistor switch after a few operations of the load. The charge on capacitor C with no load on the solid state switch would normally leak below any useful potential in a relatively short period of time. Under certain circumstances, it is desirable to have sufficient potential for operating the leveling system at least after several hours have lapsed. For example, a vehicle may be parked at a motel or airport for a substantial period of time before the passengers return to remove their luggage from the trunk. If no arrangement has been made for maintaining a useful potential on the capacitor, the charge will have leaked to a very low potential. In accordance with the present invention, battery A is connected to the solid state switch in a direction from the collectors to the bases for supplying a trickle electrical current to capacitor C and this trickle electrical current is due to the inherent leakage of transistors $T_1$ and $T_2$ in the direction from their collectors to their bases. This trickle current is insufficient to seriously discharge battery A over a relatively long period of time but has been found sufficient to maintain a useful potential on capacitor C for an extended period of time. FIG. 2 shows how the charge is maintained on capacitor C. Curve R indicates that the potential on capacitor C decreases quite rapidly from 12 volts down to around 8 volts and then decreases at a much more gradual rate over a period of several days. Curve S represents a condition wherein capacitor C is fully discharged to illustrate the charging rate thereof due to the reverse bias connection of battery A therewith in a direction from the collectors to the bases through transistors $T_1$ and $T_2$. The capacitor is charged to a potential approaching 0.5 volt in a relatively short period of time and then charges at a very slow rate. This arrangement prevents discharge of battery A to a point where it cannot start the vehicle engine. Therefore, capacitor C will supply sufficient potential for applying a forward bias to effectively gate the transistor switch to operate the level system for at least a few operations when demanded by the level system and will then be at a potential such that the leveling system will no longer operate because the forward bias potential will be too low to gate the transistor switch for flow of current therethrough from the battery to the load. Battery A will not be capable of charging capacitor C back up to a useful potential until after the ignition switch is turned on and this protects battery A against being seriously discharged.

In the arrangement shown, the transistors define a solid state switch and the capacitor is connected for supplying an input signal to that switch when the capacitor is charged. Battery A is connected through switch 18 for charging capacitor C and for supplying the forward bias to the solid state switch when mechanical switch 18 is closed. Battery A is also connected through the solid state switch to capacitor C for supplying a small leakage or trickle electrical current to capacitor C when mechanical switch 18 is open.

The reverse bias connection of battery A through the transistors may be considered a charge retaining means which connects substantially less than the full potential of battery A across capacitor C for inhibiting leakage of the charge on capacitor C. When mechanical switch 18 is closed to apply the battery potential across capacitor C, the load defined by the leveling system is biased directly off the battery. When the battery potential is removed from across the capacitor, the load defined by the leveling system is biased directly off the capacitor. The load defined by the leveling system is biased by a potential of about 5 volts which is substantially less than the full 12 volt potential of battery A. The charge retaining means connects a potential across capacitor C which is substantially less than the minimum potential on which the load is biased. For example, the potential provided by the reverse bias connection through the transistors is less than 1 volt.

Capacitor C is such that a full charge thereon normally leaks to substantially less than the desired minimum electrical potential in a relatively short period of time when mechanical switch 18 is open. The charge retaining means defined by the reverse bias connection of the battery through the transistors maintains the charge on capacitor C for a substantially longer time than the short period of time over which the charge would normally hold. As shown in FIG. 2, capacitor C will maintain a charge of nearly 5 volts for a period of nearly two full days.

Although many different voltage sources, transistors, resistors and capacitors may be used, values of components which have been used in a test system will be given simply for purposes of illustration and not for purposes of limitation. In one operative system, battery A was a 12.6 volt potential automobile battery. Capacitor C was a 12 volt DC electrolytic 500 microfarad capacitor. Transistor $T_1$ was a Type NPN silicone 200 milliwatt 100 to 1 current gain. Transistor $T_2$ was a Type NPN silicone 5 watt 25 to 1 current gain. Resistor $R_1$ was 2,200 ohms, 0.5 watt. Resistor $R_2$ was 220 ohms, 0.5 watt.

For purposes of description, mechanical switch 18 may also be considered a control switch because it is manually operable between closed and open positions.

Although the invention has been shown and described with respect to a preferred embodiment, it is obvious that equivalent alterations and modifications will occur to others skilled in the art upon the reading and understanding of this specification. The present invention includes all such equivalent alterations and modifications, and is limited only by the scope of the claims.

I claim:

1. A stored energy module including a battery, a switch, a capacitor and a transistor having a base, collector and emitter, said capacitor being series connected with said transistor for applying a forward bias from said base to said emitter, said battery being connected with said collector for applying a reverse bias from said collector to said base and for supplying current to a load only through said transistor from said collector to said emitter, said battery being connected through said switch between said capacitor and transistor for charging said capacitor and applying a forward bias from said base to said emitter when said switch is closed, said capacitor being connected to no other voltage source except said battery and being connected thereto only as aforesaid through said transistor or through said switch, and said battery being connected with the load only as aforesaid through said transistor.

* * * * *